US006909166B2

United States Patent
Frezza et al.

(10) Patent No.: US 6,909,166 B2
(45) Date of Patent: Jun. 21, 2005

(54) LEADS OF A NO-LEAD TYPE PACKAGE OF A SEMICONDUCTOR DEVICE

(75) Inventors: Giovanni Frezza, S. Donato Milanese (IT); Roberto Tiziani, Nerviano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 167 days.

(21) Appl. No.: 10/246,781

(22) Filed: Sep. 18, 2002

(65) Prior Publication Data

US 2003/0057542 A1 Mar. 27, 2003

(30) Foreign Application Priority Data

Sep. 21, 2001 (IT) ...................................... MI2001A1965

(51) Int. Cl.[7] ........................................... H01L 23/495
(52) U.S. Cl. ....................... 257/666; 257/698; 257/787; 257/E23.061
(58) Field of Search ................................ 257/666, 698, 257/674, 787, E23.061

(56) References Cited

U.S. PATENT DOCUMENTS

| | | | | |
|---|---|---|---|---|
| 3,789,311 A | * | 1/1974 | Masuda | 330/6 |
| 3,900,813 A | * | 8/1975 | Masuda et al. | 338/32 R |
| 4,012,765 A | * | 3/1977 | Lehner et al. | 257/670 |
| 4,791,472 A | * | 12/1988 | Okikawa et al. | 257/669 |
| 5,132,772 A | * | 7/1992 | Fetty | 257/779 |
| 5,329,159 A | * | 7/1994 | Lin | 257/666 |
| 5,729,437 A | * | 3/1998 | Hashimoto | 361/760 |
| 5,886,400 A | * | 3/1999 | Letterman et al. | 257/675 |
| 6,455,354 B1 | * | 9/2002 | Jiang | 438/118 |
| 6,483,178 B1 | * | 11/2002 | Chuang | 257/672 |
| 6,666,647 B1 | * | 12/2003 | Trask | 415/211.2 |
| 2003/0006055 A1 | * | 1/2003 | Chien-Hung et al. | 174/52.1 |

FOREIGN PATENT DOCUMENTS

| | | | | |
|---|---|---|---|---|
| JP | 2-310956 | * | 12/1990 | ................ 257/666 |
| JP | 3-171655 | * | 7/1991 | ................ 257/666 |
| JP | 5-55438 | * | 3/1993 | ................ 257/696 |
| JP | 5-74831 | * | 3/1993 | ................ 257/666 |
| JP | 10-41605 | * | 2/1998 | ............ H05K/1/18 |

* cited by examiner

Primary Examiner—Jasmine Clark
(74) Attorney, Agent, or Firm—Carol W. Burton, Esq.; William J. Kubida, Esq.; Hogan & Hartson L.L.P.

(57) ABSTRACT

The present invention relates to leads of a No-Lead type package which includes a chip having an active surface and a rear surface opposite the active surface. The active surface has a plurality of connection points with a plurality of leads arranged around the perimeter of the chip and a first and a second surface orthogonal to said first surface. A plurality of connection wires connect electrically the bonding pads of the chip to the first surface of the leads respectively. The package also includes a welding compound suitable for encapsulating the chip, the first surface of the leads and the bonding pads. The leads possess at least one hole in the second surface of the leads.

7 Claims, 6 Drawing Sheets

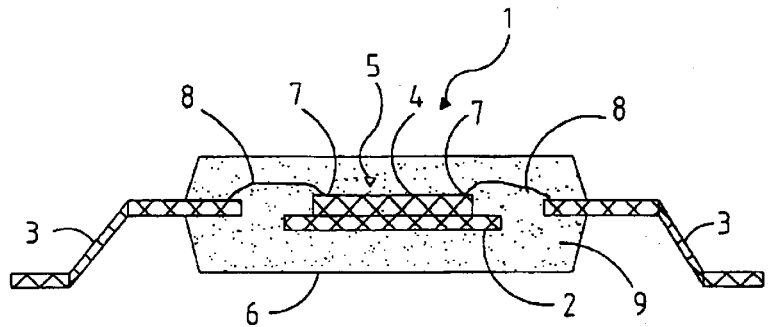
Fig.1  PRIOR ART
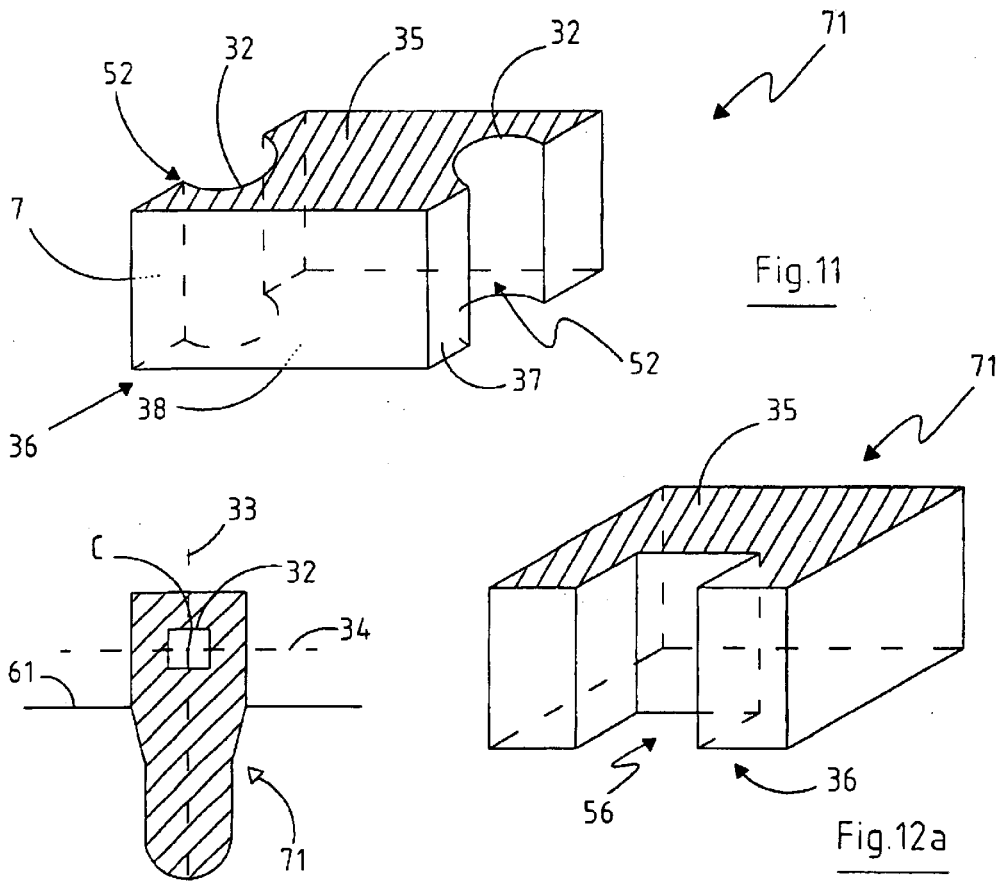

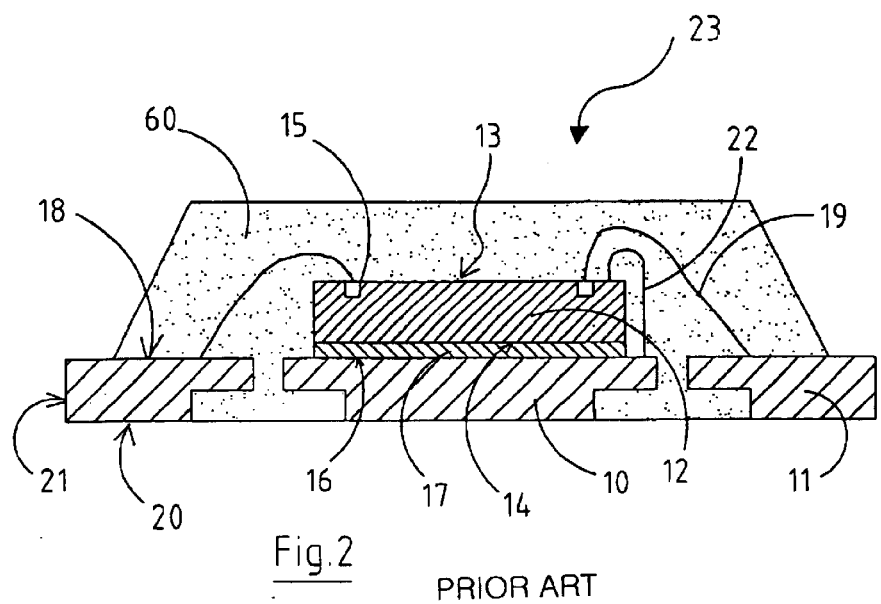
Fig.2  PRIOR ART
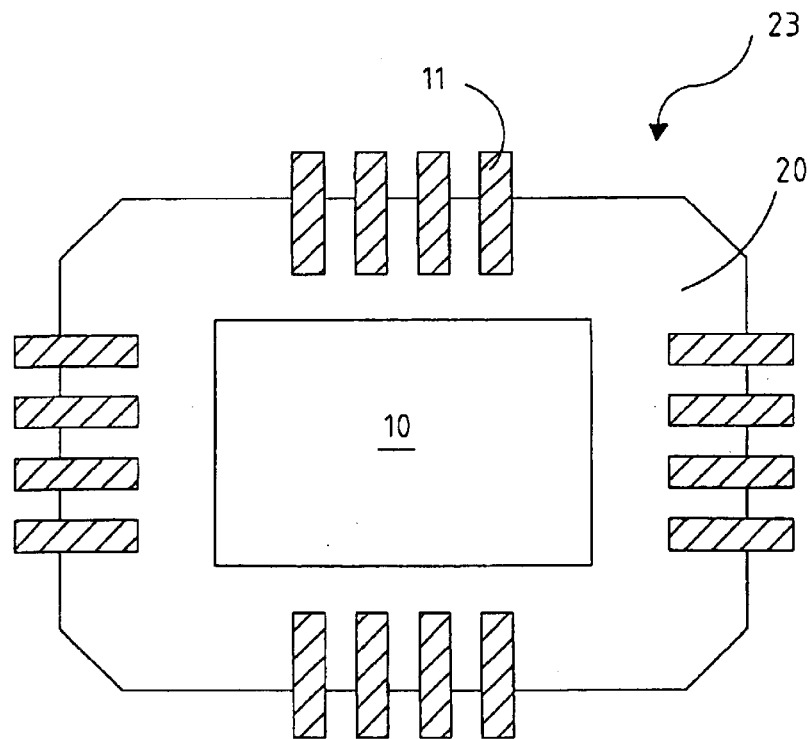
PRIOR ART  Fig.3

LEADS OF A NO-LEAD TYPE PACKAGE OF A SEMICONDUCTOR DEVICE

BACKGROUND OF THE INVENTION

1. Field of the Invention

The present invention refers to the leads of a No-Lead type package of a semi-conductor device, in particular but not exclusively to the leads of a Quad Flat No Lead type package of a semiconductor device.

2. Background of the Invention

Pursuing the evolution of integrated circuits, the manufacturing process of an integrated circuit has reached such levels of integration that there is the need to use package structures capable of meeting the increasingly insistent requests for reduction in cost, weight, section, and dimensions with the same reliability and usability.

These needs have been partially resolved through the introduction of a family of package commonly known as Chip Scale Package (CSP), whose characteristics include the reduction of dimension and weight, an easier assembly process, an increase in performance and a general reduction in production costs.

The reduction of dimensions and weight are probably the most important factors among these characteristics, for use of the CSP technology.

In particular CSP technology can be divided into two large package types: 1) the so-called Grid Arrays; 2) the so-called Quad Flat Leads.

A transversal section of a known package of the Quad Flat Leads (QFL) type is shown in FIG. 1.

The structure 1 of the QFL package, having a die pad 2 surrounded by a plurality of leads 3, can be seen in said FIG. 1. The presence of a chip 4 that has an active surface 5 and a rear surface 6 can also be noted. Chip 4 has its rear surface 6 connected to the die pad 1, while the active surface 5 provides for a plurality of bonding pads 7 for making the external connections of the chip 4 itself.

The bonding pads 7 are electrically connected to the leads 3 by means of bonding wires 8.

In addition a molding compound 9 normally encapsulates the whole chip 4, the die pad 1, the bonding wires 8 and a portion of the leads 3.

The QFL typology, just illustrated, in turn provides for a category without the leads themselves, that is the Quad Flat No-Lead o Leadless (QFN) typology.

A package like this carries to the extreme the concepts of miniaturization, as it presents a reduced package footprint, a thin profile and reduced weight.

Consequently, the manufacturers of video cameras, cellular telephones and laptops heavily rely on the use of QFN in their consumption products.

A section view of a Quad Flat No-Lead package of a semiconductor in accordance with the known art is shown in FIG. 2.

A plan view of the rear side corresponding to FIG. 2 is shown in FIG. 3.

As shown in FIGS. 2 and 3 this type of package 23 includes a die pad 10 that has a plurality 11 of leads surrounding the die pad 10 itself. The presence of a chip 12 that has an active surface 13 and a rear surface 14 can also be seen. On the active surface 13, there are a plurality of bonding pads 15 suited to enabling the external connection. The rear surface 14 of the chip 12 is connected to the upper surface 16 of the die pad 10 by means of an adhesive layer 17, while the bonding pads 15 are electrically connected to the upper surface 18 of the leads 11 respectively by means of a bonding wire 19.

In addition, the die pad 10 is usually connected to ground by means of a bonding wire 22 so as to increase the electrical performance through a reduction of the interferences.

A molding compound 60 encapsulates the whole chip 12, the bonding wires 19, and the upper surface 18 of the leads 11 while it exposes the lower surface 20 and the side surface 21 of the leads 11 for the external connections.

In fact the lower surface 20 of the leads 11 is successively welded to a PCB (Printed Circuit Board), as shown in FIG. 4, through technical means that are well known to a technician of the sector.

A micro-section 24 between a lead 11 and a bonding pad 25 of a PCB 26 is illustrated in said FIG. 4. There is a welding paste 27 between the lead 11 and the bonding pad 25 of the PCB 26.

The main problem of the QFN packages is caused by the non-alignment (mismatch) between the leads and the PCB, which is created during the turn on/turn off cycles of the device in the interval of the operative temperatures provided for, because of the different thermal expansion of the materials involved.

This brings high mechanical stress in the welding points between the leads and the PCB, as shown successively in FIG. 6.

This problem is accentuated because of the intrinsic structure of the QFN package, due that is to the shape of the contact pad and the dimensions of the pad, as the welding joint between the package QFN and the PCB is extremely small.

In fact, given the structure of the leads 11 of the QFN package, it is technically complex and economically unfavorable to increase the lower contact surface 20 of the leads 11 with the PCB, as this would lead to an increase in the footprint of the QFN package and therefore the occupation of a greater area.

The Applicant has carried out various turn on/off simulations of the chip 12, verifying the behavior of the welding points between QFN package and PCB, noting in particular that there are various problems, among which: 1) electrical failures; and 2) high torsion stress in the welding with consequent early mechanical breakages of the welding point.

A graph is represented in FIG. 5, having the number of cycles on the x coordinate and on the y coordinate the percentage of failures, of two devices, having different physical dimensions and represented respectively with a circle (device with greater dimensions) and a triangle (device with lower dimensions), from which it can be deducted that several cycles of turn off/on are enough (around a few hundred), in an interval of operative temperatures of between −40° C. and +150° C., to cause electrical failures of the welding joint.

In addition this phenomenon is overemphasized when the dimension of the package is increased.

The Applicant has also verified that breakages occur in the welding joints, when said devices are submitted to the same test cycles, that depend mainly on the dimension of the lead, noting that the smaller the lead is, sooner occur the breakages in contrast with what happens for electrical failures.

A micro-section 28 between a lead 11 and a pad 25 of a PCB is shown in FIG. 6. From this micro-section 28 a mismatch between lead 11 and pad 25 can be seen, with lack of welding material 27. This leads both to a deterioration of the electrical performance of the joint and to lower mechanical reliability of the joint.

Other problems that afflict the QFN packages can arise during the process of cutting the QFN package itself from the lead frame, a process known as a "singulation process".

In fact, during this operation, as the leads 11 of the QFN package are cut mechanically by means of cutting tools and as these leads 11 are emerged in the plastic package 60, there is a possibility that when the cut is made a delaminating is created on the side surfaces 21 of the leads 11.

This means that the bonding wires 19 welded on the upper surface 18 of said leads 11 can be stressed, making the joint mechanically weak.

Unfortunately the common QFN packages show considerable delaminations between the end of the leads and the welding compound, with the obvious repercussions on the level of reliability of the device.

This inconvenience cannot be attenuated, not even with the use of refined and very expensive molding compounds.

Another inconvenience is found in the fact that following the operation of cutting the QFN package from the lead frame, the side surface 21 of the lead 11 is exposed to the ambient atmosphere.

As the lead 11 is generally made with a material such as copper, this oxidizes rapidly causing a drop in the electrical performance.

Another inconvenience that affects the QFN packages occurs when the QFN package itself is welded onto PCB.

In fact, a lead 11 of the QFN package only offers the lower surface 20 to carry out the operation of welding to the PCB.

This entails a welding joint having a reduced contact surface, thus making it weaker and thus more easily subjected to mechanical breakages.

In addition the material making up the leads 11 cannot be welded to the PCB until after an electroplating operation.

From what has been shown up to now, the doubtless advantages offered by the Quad Flat No Lead packages appear evident, but the number and type of technical problems that have to be dealt with in producing such packages are also evident.

SUMMARY OF THE INVENTION

In view of the state of the technique described, the object of the present invention is to reduce the mechanical stress on the leads of the QFN package during the cutting process.

Another object of the present invention is to increase the welding surface between the leads of the QFN package and the PCB.

In accordance with the present invention, this object is reached by means of leads of a No-Lead type package of a semiconductor device, said No-Lead type package comprising: a chip, such as a processor, having an active surface and a rear surface opposite said active surface, said active surface having a plurality of connection points; a plurality of leads, arranged around the perimeter of said chip and having a first and a second surface orthogonal to said first surface; a plurality of connection wires that electrically connect said bonding pads of said chip to said first surface of said leads respectively; a welding compound, suitable for encapsulating said chip, said first surface of said leads and said bonding wires so as to form said package; as said leads are characterized in that each one of them possesses at least one hole in said second surface of said leads.

Thanks to the present invention the surface of the lead submitted to the cutting process can be minimized, so as to reduce mechanical stress of the welding joint between lead and PCB.

In addition thanks to the present invention the weldable surface of the lead can be increased, so as to diminish the delaminating and the oxidation.

In addition the present invention favors the separation of the QFN package from the lead frame.

BRIEF DESCRIPTION OF THE DRAWINGS

The characteristics and the advantages of the present invention will appear evident from the following detailed description of some embodiments thereof, illustrated as non-limiting examples in the enclosed drawings, in which:

FIG. 1 shows a transversal section of a quad flat leads type package, according to the known technique;

FIG. 2 shows a transversal section of a quad flat leads type package, according to the known technique;

FIG. 3 shows a plan view of the rear side corresponding to FIG. 2;

FIG. 11 shows another embodiment of the present invention;

FIGS. 12 and 12a show another embodiment of the present invention;

DETAILED DESCRIPTION

Figure 4:
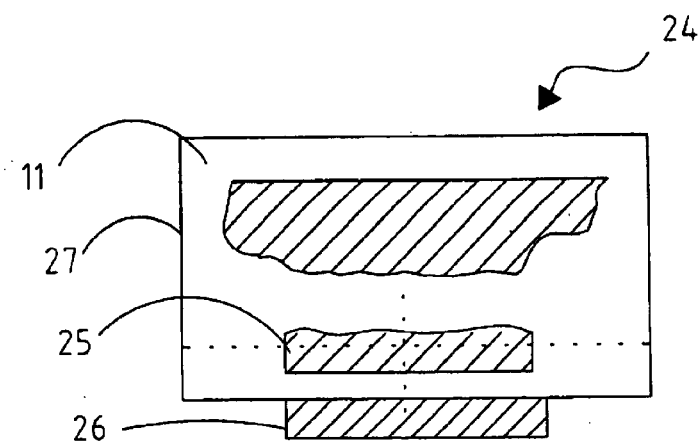
FIG. 4 shows a micro-section between a lead and the PCB, according to the known technique.
Figure 5:
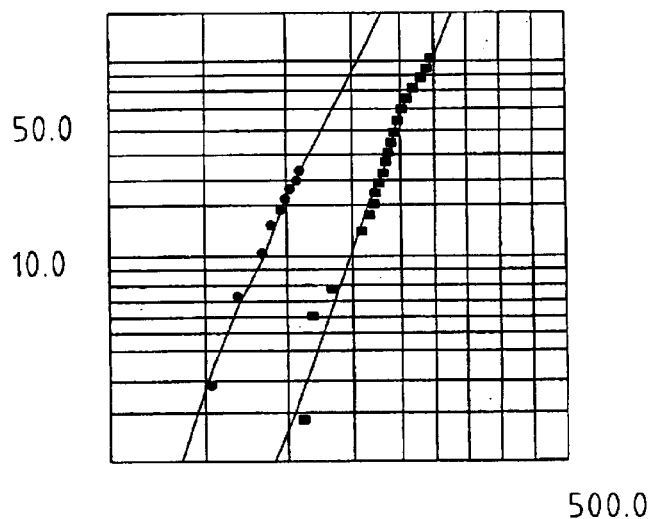
FIG. 5 shows a graph indicating the results of various simulations.
Figure 6:
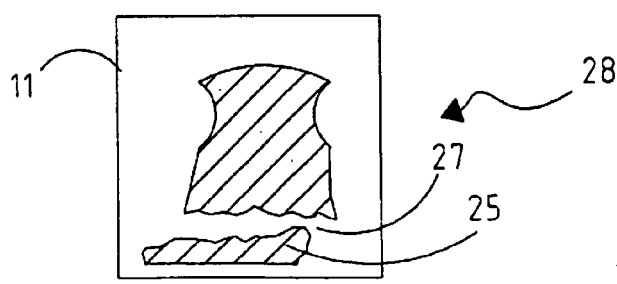
FIG. 6 shows another micro-section in the case of a breakage between a lead and the PCB.
Figure 7:
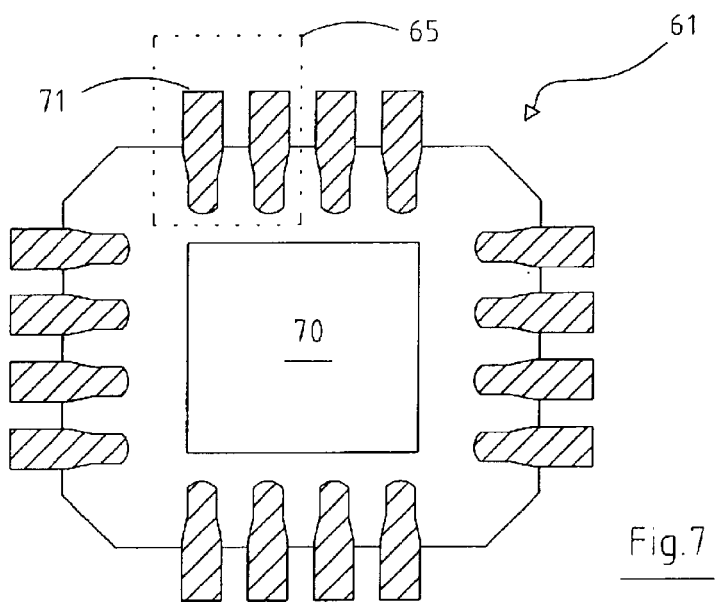
FIG. 7 shows a plan view of the rear side of an embodiment of the leads in accordance with the present invention.

A plan view of the rear side of an embodiment of the present invention is shown in FIG. 7. Said FIG. 7 shows a plurality of leads 71 that surround die pad 70 of a package 61. These leads 71 have a particular missile shape as can be seen in FIG. 8.

Figure 8:
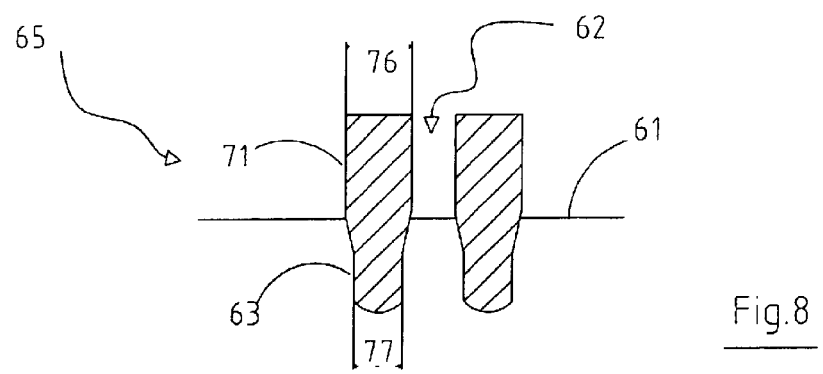
FIG. 8 shows in detail a detail of FIG. 7.

In fact, as shown in detail in FIG. 8, said leads 71 have a rectangular shape for the external portion 62 of the package 61, while for the internal portion 63 of the package 61 they have a shape that resembles a missile.

Figure 8A:
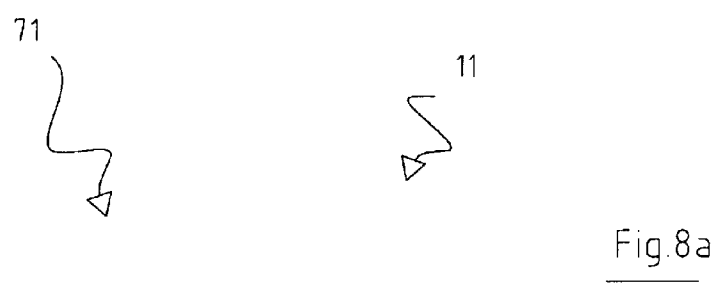
FIG. 8a shows a comparison between a lead in accordance with the present invention and a known lead.

In this manner a contact surface of over about 20% is obtained, in comparison with traditional leads 11 as shown in FIG. 8a, with the obvious advantages that derive.

As said FIG. 8a shows, the innovative lead 71 is obtained thanks to a chemical etching process by means of which lead 71 itself can be etched for a depth equal to the half of the material constituting the lead 71, commonly known as half etching process.

In this manner a type of step 80 is obtained thanks to which the molding compound 60 finds a more efficient hold.

In other words the lead 71 for the portion 63 undergoes a chemical etching operation by means of a specially made process mask, thanks to which a low relief zone 80 is created which acts as anchorage between the molding compound 60 and the lead 71 itself.

In addition as can be deducted from said FIG. 8, the surface portion 62 of the lead 71, outside the package 61, has a linear dimension 76 which is greater than the linear dimension 77 of the internal surface portion 63.

Figure 9:
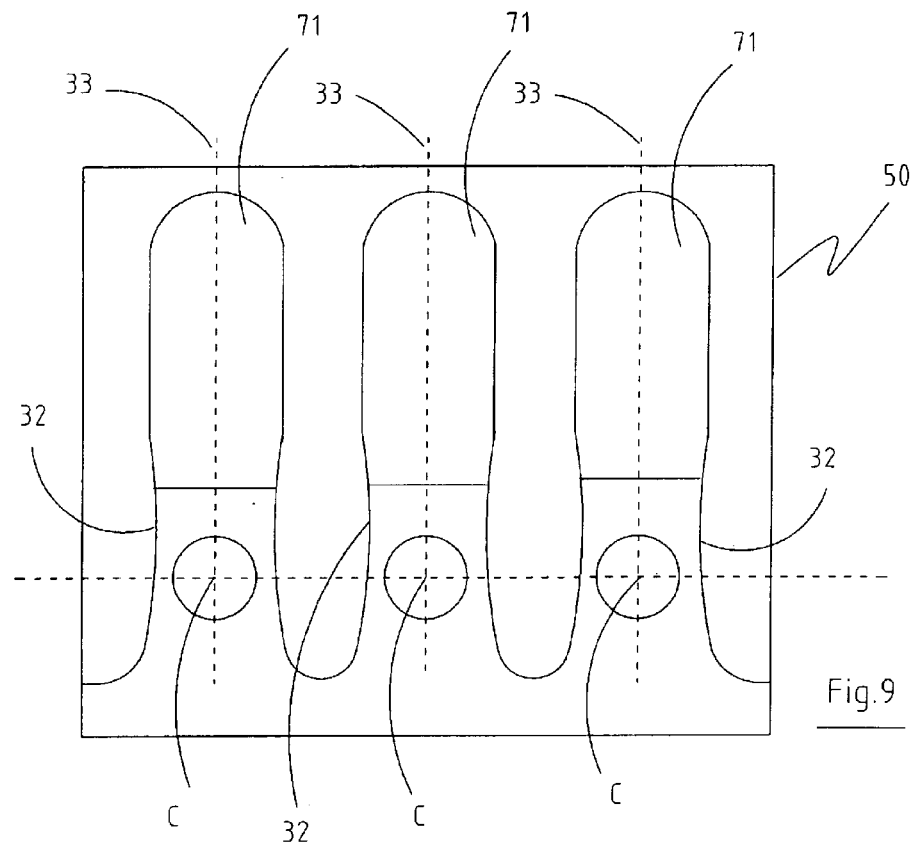
FIG. 9 shows a further embodiment of the present invention.

A further embodiment of the present invention is shown in FIG. 9.

According to what is illustrated in said FIG. 9, a plurality of leads 71 can be seen which have respectively a hole 32, a first median line 33 of said leads 71 and a second line 34, representing the cutting line (dam bar) between the QFN package and the lead frame 50.

Said hole 32, in this particular embodiment, is a through hole and has a circular section with its center C at the point at which said median line 33 crosses over said cutting line 34.

Figure 10:
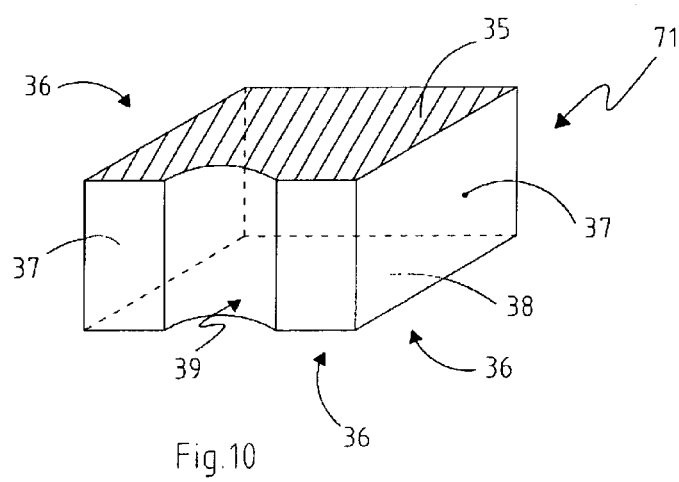
FIG. 10 shows a three-dimensional view of the embodiment of FIG. 9.

A three-dimensional view of a lead 71 after the operation of cutting the QFN package from the lead frame 50 has been carried out is shown in FIG. 10.

As can be seen in said FIG. 10, the lead 71 presents an upper surface 35, a side surface 36 and a lower surface 38.

It is to be noted that the upper surface 35 is the surface that is welded to the PCB, after the electro-plating operation, while the lower surface 38 is the surface that possesses the bonding pad suitable for connecting the chip 12 by means of the bonding wire 19 towards the outside.

The side surface 36 presents a cylindrically-shaped etching 39, result of the operation of cutting the QFN package from the lead frame 50 thanks to the presences of said through hole 32.

As previously said one of the problems of the leads 11 belonging to traditional QFN packages is due to the fact that they have only one surface that can be welded to the PCB.

With the present invention, the lead frame 50, after post mold curing, undergoes a plating operation. In this manner also the through hole 32 is plated and therefore also the side surface 36, specifically in the cylindrically-shaped etching zone 39, can be welded to a PCB (not shown in FIGS. 9 and 10).

Therefore, following the welding operation, the leads 71 of the QFN package are electro-plated with a tin-lead alloy, as with the lead frame 50.

In this manner the side surface 36 becomes weldable increasing considerably the surface of the leads 71 welded to the PCB, as in addition to the usual lower surface 35 there is also the side surface 36.

Nevertheless, the invention does not increase the footprint of the QFN package.

The remaining perimetric zone of the side surface 36 cannot be welded, because the electro-plating operation does not concern them, as they are encapsulated by the resin 60.

Obviously, the position and the geometrical shape of the through hole 32 can be different as shown in FIGS. 9 and 10.

In fact the Applicant has found it just as effective to carry out holes 32 positioned on the perimetric zones 37 of the leads 71, as shown in FIG. 11.

In said FIG. 11 it can be seen that the lead 71 possesses a pair of holes 32 in the perimetric zones 37, entailing a double cylindrically-shaped etching 52.

In this case the electro-plating operation concerns the upper surface 35 and the cylindrically-shaped etchings 52.

In addition the Applicant has found just as effective to carry out holes 32 with elliptical or quadrangular shapes, the latter with pointed or smoothed corners, as shown in FIGS. 12 and 12a.

In said FIGS. 12 and 12a it can be noted that the lead 71 possesses a through hole 32 with quadrangular section in the side surface 36, originating an etching 56 with a parallelepiped shape.

In this case the electro-plating operation concerns the upper surface 35 and the etching 56 with a parallelepiped shape.

Figure 13:
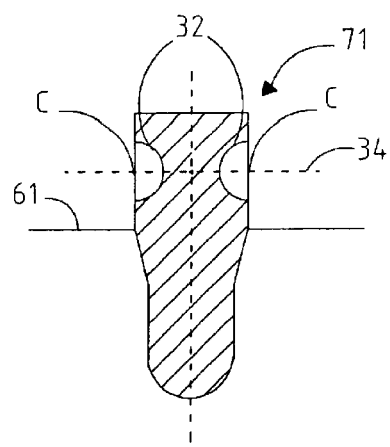
FIGS. 13 and 13a show a successive embodiment of the present invention.
Figure 13A:
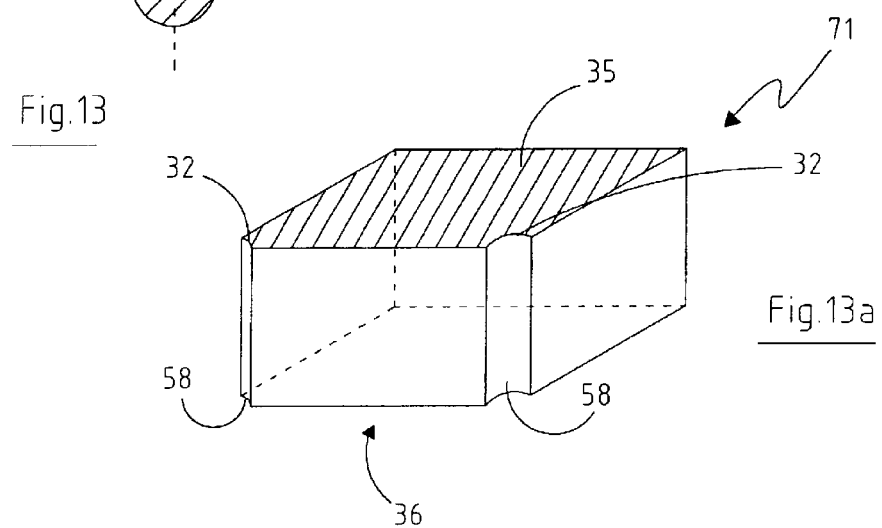

In addition, the Applicant has made leads 71 with two or more holes 32 with a circular section, elliptical or quadrangular on the side surface 36 or in the perimetric zones 37, as shown in FIGS. 13 and 13a.

In said FIGS. 13 and 13a it can be seen that the holes 32 are placed at the end of the side surface 36, giving rise to a double cylindrically-shaped etching 58.

In this case the electro-plating operation concerns the upper surface 35 and the double cylindrically-shaped etching 58.

Figure 14:
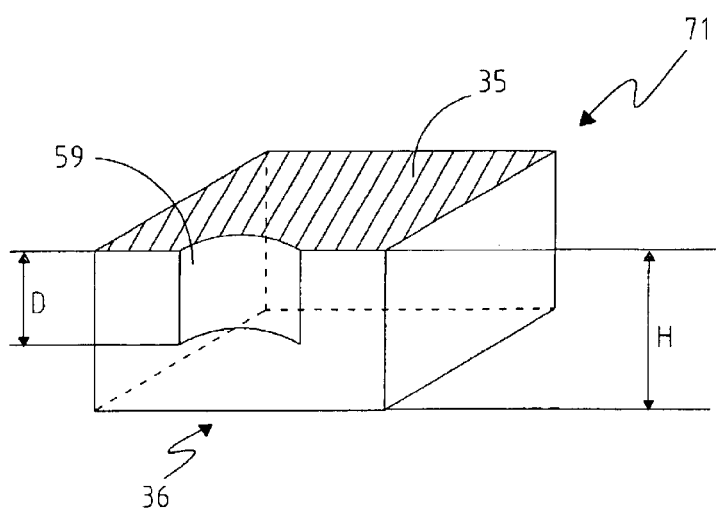
FIG. 14 shows a further embodiment of the present invention.
Figure 7:
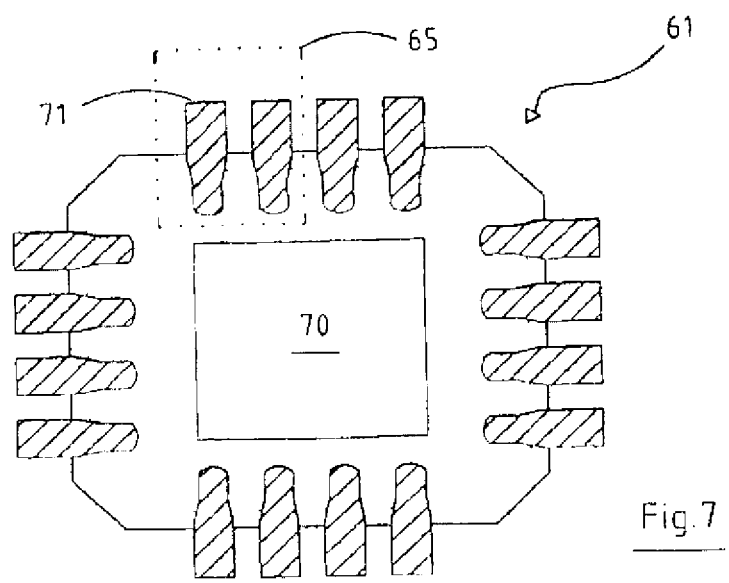
Figure 8:
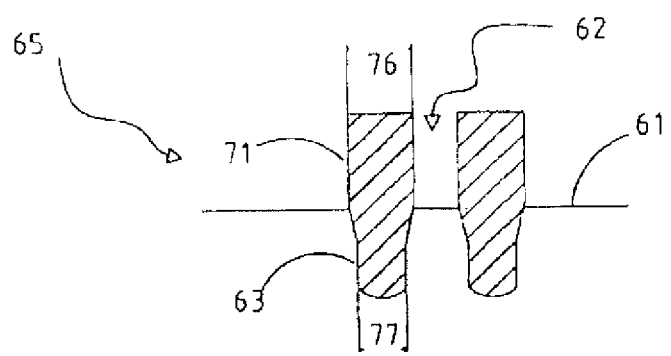
Figure 8A:
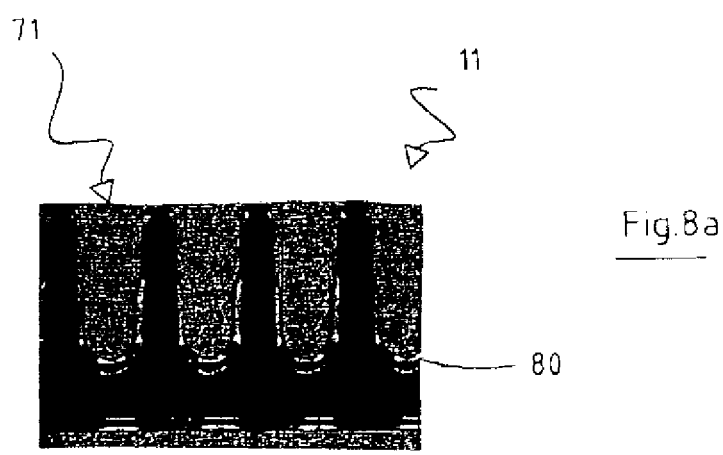

In conclusion, the Applicant made leads 71 with one or more blind holes 32, with a circular, elliptical or quadrangular section, on the side surface 36, said blind holes 32 having a depth which depends on the dimensions of the lead 71 itself, as shown in FIG. 14.

In said FIG. 14 it can be seen that the blind hole 32, has a depth D which exceeds half the height H of the lead 71.

It is also to be noted that in the embodiments illustrated in FIGS. 9, 10, 12, 12a, and 14, the hole 32, whatever section it has, has been represented as having its center C on the meeting point between said median line 33 and said cutting line 34, but, just as valid the embodiments in accordance with which the center C of the hole 32 is placed in any point of the external surface portion 62 of the lead 71, as long as said sections cross over with said cutting line 34.

What is claimed is:

1. Leads for a "No-Lead" type package of a semiconductor device, said No-Lead type package comprising:
    a chip having an active surface and a rear surface opposite to said active surface, said active surface having a plurality of connection points;
    a plurality of leads arranged around the perimeter of said chip and having a first and a second surface orthogonal to said first surface;
    a plurality of connection wires which connect electrically said bonding pads of said chip to said first surface of said leads respectively; and
    a molding compound suitable for encapsulating said chip, said first surface of said leads and said bonding wires so as to for said package; wherein said leads have a first dimension external to said package and a second dimension internal to said package, said first dimension being greater than said second dimension and each of said leads possessing at least one hole in said second surface of said leads.

2. Leads for a "No-Lead" type package of a semiconductor device according to claim 1, wherein said at least one hole is a through hole.

3. Leads for a "No-Lead" type package of a semiconductor device according to claim 1, wherein said at least one hole is blind, whose depth (D) depends on the dimensions of said lead.

4. Leads for a "No-Lead" type package of a semiconductor device according to claim 2, wherein said at least one hole is a hole with a circular section.

5. Leads for a "No-Lead" type package of a semiconductor device, said No-Lead type package comprising:
- a chip having an active surface and a rear surface opposite to said active surface, said active surface having a plurality of connection points;
- a plurality of leads arranged around the perimeter of said chip and having a first and a second surface orthogonal to said first surface;
- a plurality of connection wires which connect electrically said bonding pads of said chip to said first surface of said leads respectively; and
- a molding compound suitable for encapsulating said chip, said first surface of said leads and said bonding wires so as to form said package; each of said leads possessing at least one hole in said second surface of said leads, said at least one hole is a through hole and wherein said at least one hole is a hole with an elliptical section.

6. Leads for a "No-Lead" type package of a semiconductor device, said No-Lead type package comprising:
- a chip having an active surface and a rear surface opposite to said active surface, said active surface having a plurality of connection points;
- a plurality of leads arranged around the perimeter of said chip and having a first and a second surface orthogonal to said first surface;
- a plurality of connection wires which connect electrically said bonding pads of said chip to said first surface of said leads respectively; and
- a molding compound suitable for encapsulating said chip, said first surface of said leads and said bonding wires so as to form said package; each of said leads possessing at least one hole in said second surface of said leads, said at least one hole is a through hole and wherein said at least one hole is a hole with a quadrangular section, with pointed or smooth corners.

7. Leads for a "No-Lead" package of a semiconductor device, said No-Lead type package comprising:
- a chip having an active surface and a rear surface opposite to said active surface, said active surface having a plurality of connection points;
- a plurality of leads arranged around the perimeter of said chip and having a first and a second surface orthogonal to said first surface;
- a plurality of connection wires which connect electrically said bonding pads of said chip to said first surface of said leads respectively; and
- a molding compound suitable for encapsulating said chip, said first surface of said leads and said bonding wires so as to form said package; each of said leads possessing at least one hole in said second surface of said leads, wherein said leads have a first surface portion external to said package having a rectangular shape, and a second surface which is a continuation of said first surface and internal to said package, having a missile shape.

* * * * *

UNITED STATES PATENT AND TRADEMARK OFFICE
CERTIFICATE OF CORRECTION

PATENT NO. : 6,909,166 B2
APPLICATION NO. : 10/246781
DATED : June 21, 2005
INVENTOR(S) : Giovanni Frezza et al.

It is certified that error appears in the above-identified patent and that said Letters Patent is hereby corrected as shown below:

In the Drawings

Four (4) of six (6) Drawings:
Attached is sheet 4 of 6 of the drawings to replace the printed 4 of 6 original sheet.

In the Claims

Column 6, Line 55:
"so as to for said package; wherein said leads have a first" should read, --so as to form said package; wherein said leads have a first--.

Signed and Sealed this
Eighteenth Day of June, 2013

Teresa Stanek Rea
*Acting Director of the United States Patent and Trademark Office*